United States Patent
Kelly

(10) Patent No.: US 11,669,765 B2
(45) Date of Patent: Jun. 6, 2023

(54) COMPACT MULTI-POLE QUANTUM BIT MEASUREMENT FILTER

(71) Applicant: Google LLC, Mountain View, CA (US)

(72) Inventor: Julian Shaw Kelly, Santa Barbara, CA (US)

(73) Assignee: Google LLC, Mountain View, CA (US)

( * ) Notice: Subject to any disclaimer, the term of this patent is extended or adjusted under 35 U.S.C. 154(b) by 315 days.

(21) Appl. No.: 16/768,403

(22) PCT Filed: Dec. 15, 2017

(86) PCT No.: PCT/US2017/066732
§ 371 (c)(1),
(2) Date: May 29, 2020

(87) PCT Pub. No.: WO2019/117949
PCT Pub. Date: Jun. 20, 2019

(65) Prior Publication Data
US 2020/0320423 A1    Oct. 8, 2020

(51) Int. Cl.
*G06N 10/00* (2022.01)
*H10N 60/80* (2023.01)
*G06N 10/40* (2022.01)
*H01L 39/02* (2006.01)

(52) U.S. Cl.
CPC ............. *G06N 10/00* (2019.01); *H01L 39/02* (2013.01); *G06N 10/40* (2022.01)

(58) Field of Classification Search
None
See application file for complete search history.

(56) References Cited

U.S. PATENT DOCUMENTS

| | | | |
|---|---|---|---|
| 9,438,246 B1 * | 9/2016 | Naaman | G06N 10/00 |
| 9,444,430 B1 * | 9/2016 | Abdo | G06N 10/00 |
| 9,735,776 B1 | 8/2017 | Abdo et al. | |
| 2016/0112031 A1 | 4/2016 | Abraham et al. | |
| 2016/0156356 A1 | 6/2016 | Bronn et al. | |
| 2017/0148972 A1 | 5/2017 | Thompson et al. | |

FOREIGN PATENT DOCUMENTS

WO    WO 2017/055942    4/2017

OTHER PUBLICATIONS

Office Action in Japanese Appln. No. 2020-550584, dated Aug. 30, 2021, 6 pages (with English translation).
Decision to Grant a Patent in Japanese Appln. No. 2020-550584, dated Dec. 6, 2021, 5 pages (with English translation).

(Continued)

*Primary Examiner* — Jay C Chang
(74) *Attorney, Agent, or Firm* — Fish & Richardson P.C.

(57) ABSTRACT

A system that includes: a qubit; a qubit readout resonator arranged adjacent to the qubit to couple to the qubit; and a first filter arranged adjacent to the qubit readout resonator to couple to the qubit readout resonator, the first filter comprising: a common port arranged to receive both a qubit readout resonator input drive signal and a measurement output signal from the qubit readout resonator, wherein the first filter is configured to impede at least one measurement photon emitted from the qubit is disclosed.

18 Claims, 10 Drawing Sheets

(56) References Cited

OTHER PUBLICATIONS

Bronn et al., "Reducing Spontaneous Emission in Circuit Quantum Electrodynamics by a Combined Readout/Filter Technique," IEEE Transactions on Applied Superconductivity, Oct. 2015, 25(5): 9 pages.
PCT International Preliminary Report on Patentability in International Appln. PCT/US2017/066732, dated Nov. 28, 2019, 18 pages.
PCT International Search Report and Written Opinion in International Appln. No. PCT/US2017/066732, dated Sep. 7, 2018, 18 pages.
Sank et al., "Fast Scalable State Measurement with Superconducting Qubits," https://arxiv.org/abs/1401.0257v3, last revised Jan. 2014, 9 pages.
Office Action in Chinese Appln. No. 201780097740.3, dated Mar. 28, 2023, 30 pages (with English translation).

\* cited by examiner

COMPACT MULTI-POLE QUANTUM BIT MEASUREMENT FILTER

CROSS-REFERENCE TO RELATED APPLICATION

This application is a National Stage Application under 35 U.S.C. § 371 and claims the benefit of International Application No. PCT/US2017/066732, filed Dec. 15, 2017. The disclosure of the foregoing application is hereby incorporated by reference in its entirety.

BACKGROUND

This specification relates to a qubit system for quantum computing.

Quantum computing is a computing method that takes advantage of quantum effects, such as superposition of basis states and entanglement to perform certain computations more efficiently than a classical digital computer. In contrast to a digital computer, which stores and manipulates information in the form of bits, e.g., a "1" or "0", quantum computing systems can manipulate information using qubits. A qubit can refer to a quantum device that enables the superposition of multiple states, e.g., data in both the "0" and "1" state, and/or to the superposition of data, itself, in the multiple states. In accordance with conventional terminology, the superposition of a "0" and "1" state in a quantum system may be represented, e.g., as $\alpha|0\rangle + \beta|1\rangle$. The "0" and "1" states of a digital computer are analogous to the $|0\rangle$ and $|1\rangle$ basis states, respectively of a qubit. The value $|\alpha|^2$ represents the probability that a qubit is in $|0\rangle$ state, whereas the value $|\beta|^2$ represents the probability that a qubit is in the $|1\rangle$ basis state.

SUMMARY

The present disclosure relates to a qubit system for quantum computing. In particular, the qubit system includes a single port configured for driving a qubit readout resonator and for receiving photons reflected back to the same port. An input drive tone may be separated from outward measurement photons through circuit elements, such as a circulator or directional coupler.

In addition, the qubit system can include a filter that has multiple poles by tapping one or more portions of the filter. For example, where a portion of a filter is tapped, each of the two portions of the filter defined by the tapping can be a stub filter such that the filter has multiple poles. Since a single filter can have multiple poles, the qubit system can have less filters comparing to a qubit system using a filter having a single pole. Thus, the qubit system can have a compact design.

In general, an innovative aspect of the subject matter described in this specification can be implemented in a system that includes: a qubit; a qubit readout resonator arranged adjacent to the qubit to couple to the qubit; and a first filter arranged adjacent to the qubit readout resonator to couple to the qubit readout resonator, the first filter comprising: a common port arranged to receive both a qubit readout resonator input drive signal and a measurement output signal from the qubit readout resonator, wherein the first filter is configured to impede at least one measurement photon emitted from the qubit.

The foregoing and other implementations can each optionally include one or more of the following features, alone or in combination. The system further includes: a circulator coupled to the common port, wherein the circulator is configured to separate an input drive signal from a measurement output signal on the common port. The system further includes: a directional coupler coupled to the common port, wherein the directional coupler is configured to separate an input drive signal from a measurement output signal on the common port. The first filter comprises a bandpass filter. The bandpass filter is a Purcell filter. The qubit readout device and/or the filter comprises a microwave resonator. The microwave resonator includes a co-planar waveguide resonator, a strip-line resonator, or a microstrip resonator. The qubit readout device and the first filter are formed from a superconductor. The qubit comprises a superconducting qubit or a spin qubit. The qubit comprises a qubit with a resonant frequency that is between 300 MHz and 300 GHz. The common port taps the filter at a position such that the common port forms a stub filter between a first portion of the filter and a second portion of the filter. The stub filter includes a transmission-line filter, a lumped-element filter, or a combination of a transmission-line filter and a lumped-element filter. The first filter is a half-wave coplanar waveguide filter, and wherein the stub filter is a quarter-wave coplanar waveguide filter. A stop band of the stub filter is between 1 and 20 GHz. The system further includes a plurality of qubit devices, wherein each of the qubit devices includes: a qubit, a qubit readout resonator arranged adjacent to the qubit of the qubit device to couple to the qubit of the qubit device, and a filter arranged adjacent to the qubit readout resonator of the qubit device to couple to the qubit readout resonator of the qubit device; a common input port that is configured to receive a plurality of qubit readout resonator input drive signals for the plurality of qubit devices; and a switch that is configured to provide at least one of the plurality of qubit readout resonator input drive signals to at least one of the plurality of qubit devices. The system further includes: a plurality of qubit devices, wherein each of the qubit devices has a respective resonator frequency and that includes: a qubit, a qubit readout resonator arranged adjacent to the qubit of the qubit device to couple to the qubit of the qubit device, and a filter arranged adjacent to the qubit readout resonator of the qubit device to couple to the qubit readout resonator of the qubit device; a common input port that is configured to receive a plurality of qubit readout resonator input drive signals for the plurality of qubit devices, wherein each of the plurality of qubit readout resonator input drive signals have a respective frequency, a frequency domain multiplexer that is configured to provide, to a respective qubit device of the plurality of qubit devices, a first qubit readout resonator input drive signal of the plurality of qubit readout resonator input drive signals based on a frequency of the first qubit readout resonator input drive signal being matched to the respective resonator frequency of the qubit device. The system further includes: an amplifier that is coupled to the common port and that is configured to amplify the measurement output signal from the qubit readout resonator. The amplifier includes a parametric amplifier or a High Electron Mobility Transistor (HEMT) amplifier.

In some implementations, the subject matter described in this specification can be implemented so as to realize one or more of the following advantages.

In some implementations, where the qubit system includes a single port for receiving a qubit readout resonator input and measurement photons, the qubit system can prevent the energy leakage of a qubit regardless of a location of a filter relative to the single port.

In some implementations, where the qubit system includes a single port for receiving a qubit readout resonator input and measurement photons, the qubit system can provide the measurement photons received from one or more qubits to an amplifier through the single port. However, where a qubit system including separate input and output ports provides measurement photons to an amplifier through the output port, the qubit system may lose some of the measurement photons through the input port, e.g., 10% of the measurement of the photons. Thus, the qubit system including a single port loses less measurement photons than a qubit system including separate input and output ports, and improves the quantum efficiency.

Moreover, the qubit system including a single port for receiving a qubit readout resonator input and measurement photons gives more freedom to design a layout of a chip to implement the qubit system because the single port architecture reduces the number of ports used for transferring an input signal and an output signal comparing to a qubit system including both an input port and an output port.

In addition, the qubit system can include a filter that has multiple poles. The multiple pole filer design prevents energy leakage of a qubit better than a single pole filter design, improving energy efficiency of the qubit system. Also, since a single filter has multiple poles, less filters can be used in the qubit system. Thus, the qubit system can have a compact design.

Furthermore, the qubit system including multiple qubit devices can perform measurement operations for the multiple qubit devices using a single input port. The qubit system can use less number of ports relative to a qubit system including multiple input ports. Thus, the qubit system can be implemented as having a smaller volume relative to the qubit system including multiple input ports. In particular, where the qubit system is operated in a fridge, energy to maintain the qubit system can be saved by reducing the volume of the qubit system.

In addition, the qubit system including an FDM can perform measurement operations for probe signals having various frequencies. Thus, the qubit system can include various types of qubits and filters having various frequencies.

The details of one or more implementations of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

A qubit system can include various input/output architectures. In some cases, a qubit system can include separate input and output ports. The qubit system receives an input signal, e.g., a qubit readout resonator drive tone, through an input port, and provides an output signal, e.g., measurement photons indicative of a state of a qubit, through an output port. In some implementations, these configurations lead to leakage of photons from a qubit, resulting in inefficient system operation. To prevent the energy leakage, a qubit system can include a single port architecture. That is, the qubit system includes a common port to receive an input signal and provide an output signal. This single port architecture of the qubit system may, in some implementations, allow a filter of the qubit system to impede the propagation of a photon emitted from a qubit regardless of a location of the filter relative to the common port. Thus, energy leakage can be prevented and efficiency of the qubit system can be improved.

Figure 1A:
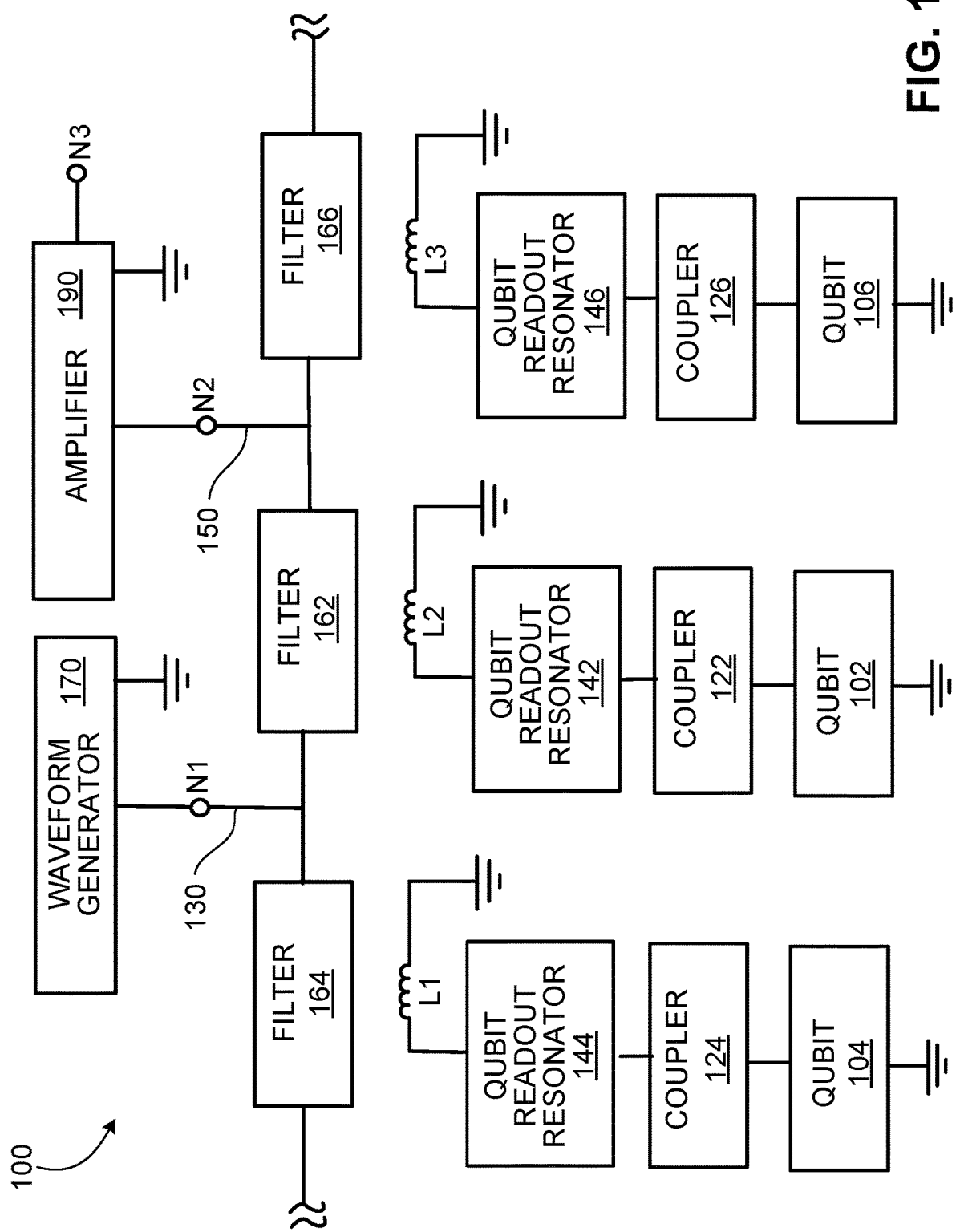
FIG. 1A is a diagram illustrating an example qubit system including an input port and an output port.

FIG. 1A illustrates an example qubit system 100 including an input port and a separate output port. The qubit system 100 performs readout measurement operations for one or more qubits. The qubit system 100 includes qubit-readout resonator pairs, filters, an input port, an output port, a waveform generator, and an amplifier.

The qubit system 100 includes qubit-readout resonator pairs. Each of the qubit-readout resonator includes a qubit and a qubit readout resonator that is coupled to the qubit. For example, the qubit-readout resonator pairs of the qubit system 100 respectively include qubits 102, 104, 106. The qubits 102, 104, 106 can be implemented with various qubits. For example, the qubits 102, 104, 106 can be superconducting qubits such as transmon qubits or flux-mon qubits. As another example, the qubits 102, 104, 106 can be spin qubits. As another example, the qubits 102, 104, 106 can be any suitable qubits having respective resonance frequencies that are within a frequency range of a microwave (e.g., between 300 MHz and 300 GHz). Although FIG. 1A illustrates that the qubit system 100 includes three qubits, the number of the qubits is not limited to a particular number.

The qubit-readout resonator pairs of the qubit system 100 also respectively include qubit readout resonators 142, 144, 146. The qubit readout resonators 142, 144, 146 may be indirectly coupled to the qubits 102, 104, 106 through couplers 122, 124, 126, respectively. In some implementations, the couplers 122, 124, 126 can be capacitive couplers having suitable capacitance to couple the qubits 102, 104, 106 to the respective resonators 142, 144, 146. Alternatively, in some other implementations, the couplers 122, 124, 126 can be inductive couplers having suitable inductance to couple the qubits 102, 104, 106 to the respective resonators 142, 144, 146. In some implementations, couplers 122, 124, and 126 are not necessary, and the qubit readout resonators 142, 144, 146 are directly electromagnetically coupled (e.g., inductively or capacitively) to the qubits 102, 104, 106, respectively.

In some implementations, since the qubit readout resonators 142, 144, 146 are coupled to the qubits 102, 104, 106, a frequency of a qubit readout resonator is determined based on a state of a qubit coupled to the qubit readout resonator. For example, the frequency of the qubit readout resonator 142 is determined based on the state of the qubit 102, the frequency of the qubit readout resonator 144 is determined based on the state of the qubit 104, and the frequency of the qubit readout resonator 146 is determined based on the state of the qubit 106. Where a state of a qubit is changed from a first state to a second state, a frequency of the qubit readout resonator coupled to the qubit is shifted accordingly, such that the frequency is indicative of the qubit state. By measuring the frequency of the qubit readout resonator, the qubit system 100 can perform a readout measurement operation for the qubit coupled to the qubit readout resonator. The qubit readout resonators 142, 144, 146 may be configured, e.g., as co-planar waveguide resonators, stripline resonators, or microstrip resonators, among other types of resonator structures. The qubit readout resonators 142, 144, 146 may be formed from superconducting material, such as aluminum, niobium, and/or titanium nitride.

The qubit system 100 includes filters 162, 164, 166. Although FIG. 1A illustrates that the qubit system 100 includes three filters, the number of the filters is not limited to a particular number. The qubit system 100 can include any suitable number of filters. In some implementations, the qubit system 100 can include the same number of filters with qubits. In some other implementations, the qubit system 100 can include more or less number of filters than qubits. The filters 162, 164, 166 may be formed from resonator structures, such as co-planar waveguide resonators, stripline resonators, or microstrip resonators. The filter structures may be formed from superconductor material, such as aluminum, niobium, and/or titanium nitride.

The filters 162, 164, 166 are coupled to the qubit readout resonators 142, 144, 146, respectively through inductors L1, L2, L3. In some implementations, the inductors L1, L2, L3 correspond to a portion of the qubit readout resonators. In this example, each inductor is coupled to a ground. Although FIG. 1A illustrates inductive coupling between the filters 162, 164, 166 and the qubit readout resonators 142, 144, 146 using the inductors L1, L2, L3, any suitable coupling techniques can be used in various implementations. For example, the filters 162, 164, 166 can be coupled to the qubit readout resonators 142, 144, 146 using a capacitive coupling technique.

In some implementations, the filters 162, 164, 166 can be Purcell filters. A Purcell filter impedes the propagation of a photon emitted from a qubit at a qubit frequency, e.g., 7 GHz. Thus, the filters 162, 164, 166 prevent energy leakage of the qubits 102, 104, 106 when the qubits 102, 104, 106 operate at the respective qubit frequency. In addition, a Purcell filter allows the propagation of a signal, e.g., a microwave signal, at a resonator frequency, e.g., 4.5 GHz. Thus, the filters 162, 164, 166 allow signals for driving the respective resonators 142, 144, 146 to pass through the filters 162, 164, 166.

In some implementations, the filters 162, 164, 166 can be bandpass filters. For example, the bandpass filters can be implemented as quarter-wave (214) or half-wave (212) coplanar waveguide filters. In some other implementations, the filters 162, 164, 166 can be any suitable filters including, but not limited to: low-pass filters, high-pass filters, or stepped impedance filters.

The qubit system 100 includes an input port 130 and an output port 150. In this implementation, the input port 130 is separated from the output port 150. The input port 130 is coupled to an input node N1. The input node N1 is coupled to a waveform generator 170 to receive one or more probe signals from the waveform generator 170. For example, the waveform generator 170 may provide a drive tone for driving a qubit readout resonator. The input port 130 may be coupled between two or more filters, e.g., the filters 162, 164.

The output port 150 is coupled to an output node N2. The output node N2 is coupled to the amplifier 190 to provide one or more output signals from one or more resonators. For example, the output port 150 may receive measurement photons from the readout resonators 142, 144, and/or 146, in which the measurement photons are indicative of the state of the qubits 102, 104, and/or 106. The amplifier 190 amplifies the one or more output signals received through the output node N2 and provides the amplified output signals to a node N3. The output port 150 may be coupled between two or more filters, e.g., the filters 162, 166. In this implementation, the waveform generator 170 and the amplifier 190 are coupled to a ground.

In some implementations, an analog-to-digital converter (ADC) can be coupled to the node N3. In some other implementations, one or more circulators can be coupled the node N3 to protect the qubits 102, 104, 106 from amplifier noise passing through the output port in reverse.

Figure 1B:
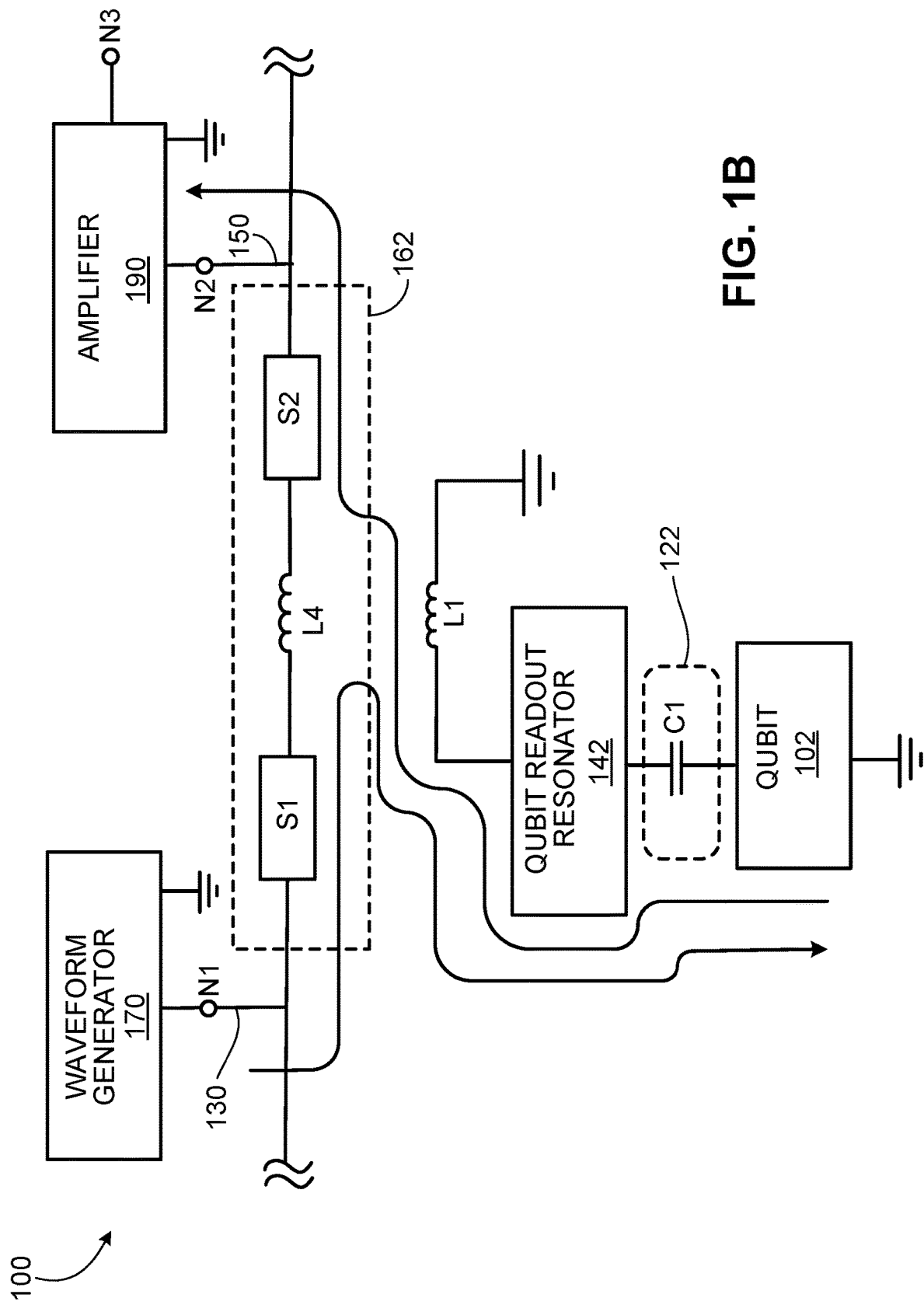
FIGS. 1B to 1D are diagrams illustrating example readout measurement operations for the qubits in FIG. 1A.

In order to better understand the operation of the qubit system of FIG. 1A, which has separate input and output ports for driving and reading qubits, a description directed to the operation of each qubit-readout resonator pair with respect to the filters, independent of the other qubit-readout resonator pairs, is now provided. FIG. 1B illustrates an example readout measurement operation for the qubit 102 in FIG. 1A. The qubit system 100 in FIG. 1B is the qubit system 100 illustrated in FIG. 1A. For convenience, the qubits 104, 106, the couplers 124, 126, the qubit readout resonators 144, 146, the inductors L2, L3, the filters 164, 166 are omitted in FIG. 1B.

In this example, the filter 162 is coupled between the input port 130 and the output port 150 and the qubit-readout resonator pair including the readout resonator 142 and the qubit 102 is coupled to a portion, e.g., a coupling portion, of the filter 162. Where the qubit-readout resonator pair is coupled to the coupling portion of the filter 162, the coupling portion of the filter 162 can be defined as an inductor L4, a first portion of the filter 162 that exists between the coupling portion and the input port 130 can be defined as a first filter stub S1, and a second portion of the filter 162 that exists between the coupling portion and the output port 150 can be defined as a second filter stub S2. Thus, electrically equivalent elements of the filter 162 include the first filter stub S1, the inductor L4, and the second filter stub S2. In some implementations, the coupling portion can be the center of the filter 162. Where the filter 162 is a half-wave coplanar waveguide filter, the filter stubs S1, S2 can be a quarter-wave coplanar waveguide filer. However, the coupling portion can be any portion of the filter 162 for various implementations and not limited to the center of the filter 162.

To perform a readout measurement operation for the qubit 102, the waveform generator 170 generates a probe signal and provides the probe signal to the filter 162 through the input port 130. The probe signal can have a frequency within a frequency range of the filter 162. For example, where the filter 162 is a bandpass filter having a frequency range from 4 to 5 GHz, a probe signal can have a frequency within the frequency range such that the probe signal can pass through the filter 162. Once the probe signal passes through the first filter stub S1, the probe signal is transferred to the qubit readout resonator 142 through the inductors L4, L1. In some implementations, the probe signal can be transferred from the filter 162 to the qubit readout resonator 142 using a capacitive coupling technique. In some implementations, the probe signal can be transferred from the filter 162 to the qubit readout resonator 142 using a combination of inductive and capacitive coupling techniques.

The qubit readout resonator 142 is coupled to the qubit 102 through the coupler 122. In this implementation, the coupler 122 is a capacitive coupler including a capacitor C1. In some other implementations, the coupler 122 can be an inductive coupler including an inductor. Alternatively, as described herein, the coupler 122 can be part of the qubit readout resonator. As described herein, where the qubit readout resonator 142 is coupled to the qubit 102, the frequency of the qubit readout resonator 142 is determined based on the state of the qubit 102. Thus, by measuring the frequency of the qubit readout resonator 142, the qubit system 100 can measure the state of the qubit 102.

To measure the frequency of the qubit readout resonator 142, the probe signal is provided to the qubit readout resonator 142 as described herein. In response to the probe signal, the qubit readout resonator 142 generates an output signal that has a particular frequency. For example, the output signal can have a resonant frequency of the qubit readout resonator 142. Based on the frequency of the output signal, the frequency of the qubit readout resonator 142 can be measured.

In some implementations, the frequency of the output signal can be within the frequency range of the filter 162. Thus, the output signal that is transferred to the second filter stub S2 through the inductors L1, L4 can pass through the second filter stub S2. The output signal is transferred to the amplifier 190 through the output port 150. The amplifier 190 amplifies the output signal because the output signal can be attenuated while the output signal is transferred from the qubit readout resonator 124 to the amplifier 190. The amplified output signal is provided to the node N3.

In the implementation of FIG. 1B, a route of the probe signal is from the waveform generator 170 to the qubit readout resonator 142 through the input port 130, the first filter stub S1, and the inductors L4, L1. Thus, while the probe signal is transferred from the waveform generator 170 to the qubit readout resonator 142, even if a photon is emitted from the qubit 102, the propagation of the photon is impeded by the first filter stub S1 or the second filter stub S2 because the filter stubs S1, S2 impedes the propagation of a photon emitted from the qubit 102 at a qubit frequency, but allows the propagation of the probe signal at a resonator frequency. This prevents energy leakage of the qubit 102 such that the efficiency of the qubit system 100 is improved.

Figure 1C:
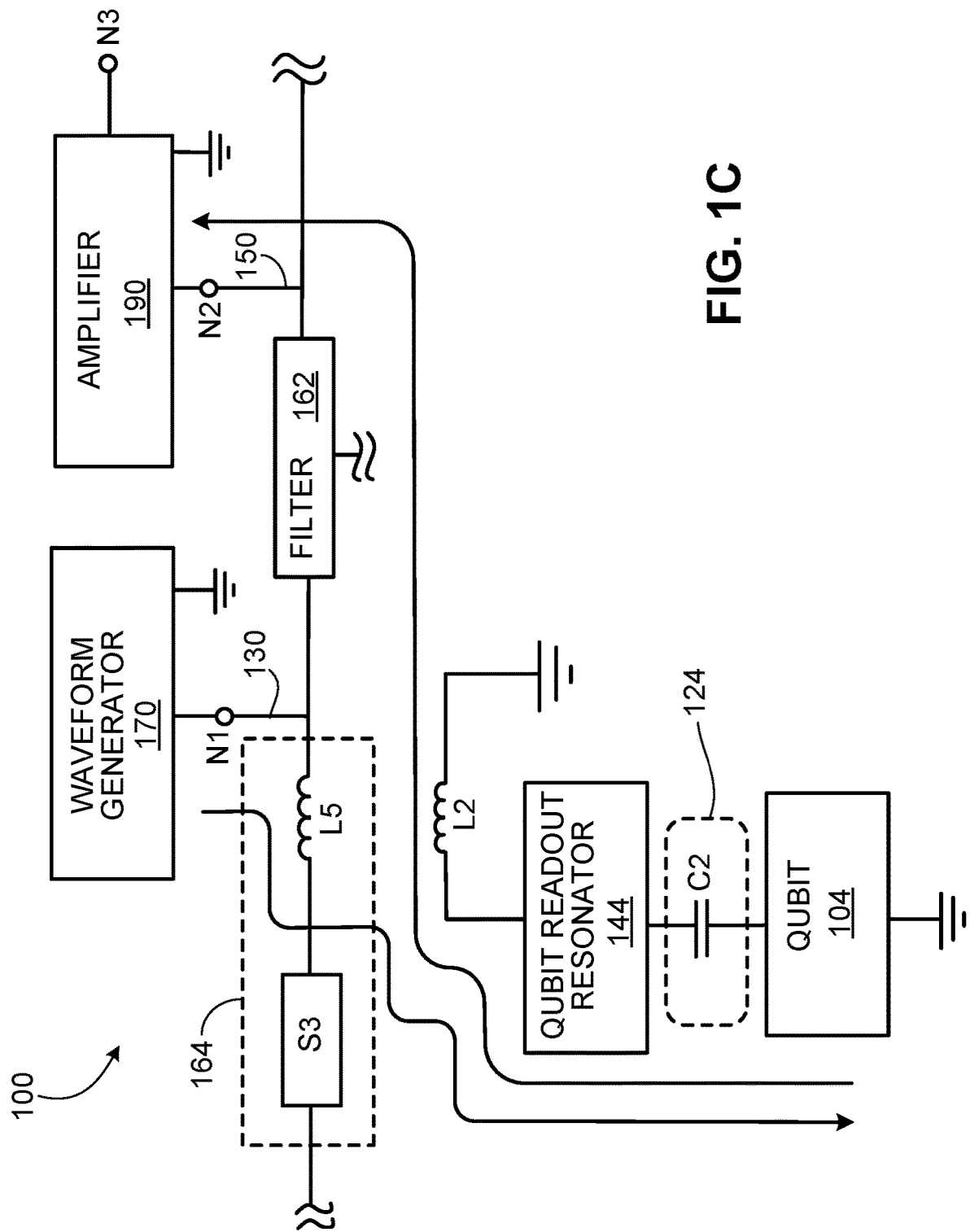

FIG. 1C illustrates an example readout measurement operation for the qubit 104 in FIG. 1A. The qubit system 100 in FIG. 1C is the qubit system 100 illustrated in FIG. 1A. For convenience, the qubits 102, 106, the couplers 122, 126, the qubit readout resonators 142, 146, the inductors L1, L3, and the filter 166 are omitted in FIG. 1C.

In this example, the filter 164 is located at one side, e.g., a left side, from the input port 130 and the output port 150. The qubit-readout resonator pair including the readout resonator 144 and the qubit 104 is coupled to a portion, e.g., a coupling portion, of the filter 164. Where the qubit-readout resonator pair is coupled to the coupling portion of the filter 164, the coupling portion of the filter 164 can be defined as an inductor L5 and a portion of the filter 164 that exists from the coupling portion to the left end of the filter 164 can be defined as a third filter stub S3. However, where the filter 164 is located at one side of the input port 130 and the output port 150, the filter 164 is strongly coupled to the input port 130 such that a filter stub does not exist between the inductor L5 and the input port 130. Thus, electrically equivalent elements of the filter 164 include a third filter stub S3 and an inductor L5.

Where a probe signal provided by the waveform generator 170 is provided to the qubit readout resonator 144, the probe signal passes through input port 130 and the inductors L5, L2 without passing through any filter stub. As a result, while the probe signal is transferred from the waveform generator 170 to the qubit readout resonator 144, if a photon is emitted from the qubit 104, the propagation of the photon cannot be impeded by the filter 164 because the filter 164 does not include any filter stub in a route of the probe signal. This can cause energy leakage of the qubit 104.

Although FIG. 1C illustrates that an inductive coupling technique is used to couple the filter 164 to the qubit readout resonator 144, any suitable coupling technique can be used to couple the filter 164 to the qubit readout resonator 144. For example, the probe signal can be transferred from the filter 164 to the qubit readout resonator 144 using a capacitive coupling technique.

The qubit readout resonator 144 is coupled to the qubit 104 through the coupler 124. In this implementation, the coupler 124 is a capacitive coupler including a capacitor C2. In some other implementations, the coupler 124 can be an inductive coupler including an inductor. As described above, where the qubit readout resonator 144 is coupled to the qubit 104, the frequency of the qubit readout resonator 144 is determined based on the state of the qubit 104. Thus, by measuring the frequency of the qubit readout resonator 144, the qubit system 100 can measure the state of the qubit 104. To measure the frequency of the qubit readout resonator 144, the probe signal is provided to the qubit readout resonator 144 as described above. In response to the probe signal, the qubit readout resonator 144 generates an output signal that has a particular frequency. For example, the output signal can have a resonant frequency of the qubit readout resonator 144. Based on the frequency of the output signal, the frequency of the qubit readout resonator 144 can be measured.

In some implementations, the frequency of the output signal can be within the frequency range of the filter 162. Thus, the output signal that is transferred to the filter 162 through the inductors L2, L5 can pass through the filter 162. The output signal is transferred to the amplifier 190 through the output port 150. The amplifier 190 amplifies the output signal because the output signal can be attenuated while the output signal is transferred from the qubit readout resonator 144 to the amplifier 190. The amplified output signal is provided to the node N3.

Figure 1D:
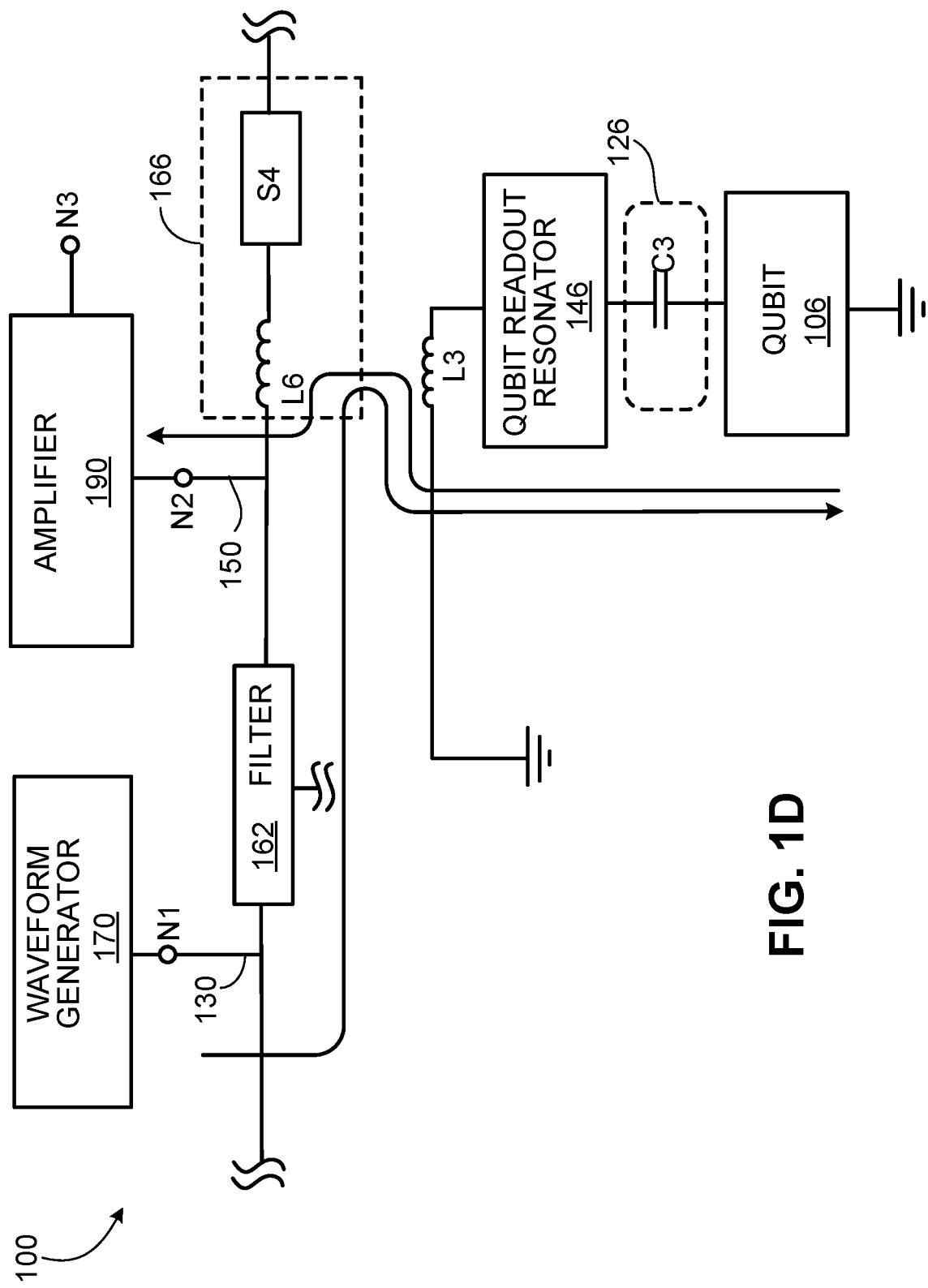

FIG. 1D illustrates an example readout measurement operation for the qubit 106 in FIG. 1A. The qubit system 100 in FIG. 1D is the qubit system 100 illustrated in FIG. 1A. For convenience, the qubits 102, 104, the couplers 122, 124, the qubit readout resonators 142, 144, the inductors L1, L2, and the filter 164 are omitted in FIG. 1D.

In this example, the filter 166 is located at one side, e.g., a right side, from the input port 130 and the output port 150. The qubit-readout resonator pair including the readout resonator 146 and the qubit 106 is coupled to a portion, i.e., a coupling portion, of the filter 166. Where the qubit-readout resonator pair is coupled to the coupling portion of the filter 166, the coupling portion of the filter 166 can be defined as an inductor L6 and a portion of the filter 166 that exists from the coupling portion to the right end of the filter 166 can be defined as a fourth filter stub S4. However, where the filter 166 is located at one side of the input port 130 and the output port 150, the filter 164 is strongly coupled to the output port 150 such that a filter stub does not exist between the inductor L6 and the output port 150. Thus, electrically equivalent elements of the filter 166 include a fourth filter stub S4 and an inductor L6.

To perform a readout measurement operation for the qubit 104, the waveform generator 170 generates a probe signal and provides the probe signal to the filter 162 through the input port 130. The probe signal can have a frequency within a frequency range of the filter 162. For example, where the filter 162 is a bandpass filter having a frequency range from 4 to 5 GHz, a probe signal can have a frequency within the frequency range such that the probe signal can pass through the filter 162. Once the probe signal passes through the filter 162, the probe signal is transferred to the qubit readout resonator 146 through the inductors L6, L3. Although FIG. 1D illustrates that an inductive coupling technique is used to couple the filter 166 to the qubit readout resonator 146, any suitable coupling technique can be used to couple the filter 166 to the qubit readout resonator 146. For example, the probe signal can be transferred from the filter 166 to the qubit readout resonator 146 using a capacitive coupling technique.

The qubit readout resonator 146 is coupled to the qubit 106 through the coupler 126. In this implementation, the coupler 126 is a capacitive coupler including a capacitor C3. In some other implementations, the coupler 126 can be an inductive coupler including an inductor. As described above, where the qubit readout resonator 146 is coupled to the qubit 106, the frequency of the qubit readout resonator 146 is determined based on the state of the qubit 106. Thus, by measuring the frequency of the qubit readout resonator 146, the qubit system 100 can measure the state of the qubit 106.

To measure the frequency of the qubit readout resonator 144, the probe signal is provided to the qubit readout resonator 146 as described above. In response to the probe signal, the qubit readout resonator 146 generates an output signal. As described above, a filter stub does not exist between the inductor L6 and the output port 150. Thus, the output signal is provided to the output port 150 through the inductors L3, L5 without passing through any filter stub. As a result, while the probe signal is transferred from the qubit readout resonator 146 to the amplifier 190, if a photon is emitted from the qubit 106, the propagation of the photon cannot be impeded by the filter 166 because the filter 166 does not include any filter stub in a route of the output signal. This can cause energy leakage of the qubit 106.

The output signal is provided to the amplifier 190 from the output port 150. The amplifier 190 amplifies the output signal because the output signal can be attenuated while the output signal is transferred from the qubit readout resonator 146 to the amplifier 190. The amplified output signal is provided to the node N3.

As described above with reference to FIGS. 1C and 1D, where the qubit system 100 includes the input port 130 and a separate output port 150, the qubit system 100 can have energy leakage if a filter is not located between the input port 130 and the output port 150.

Figure 2A:
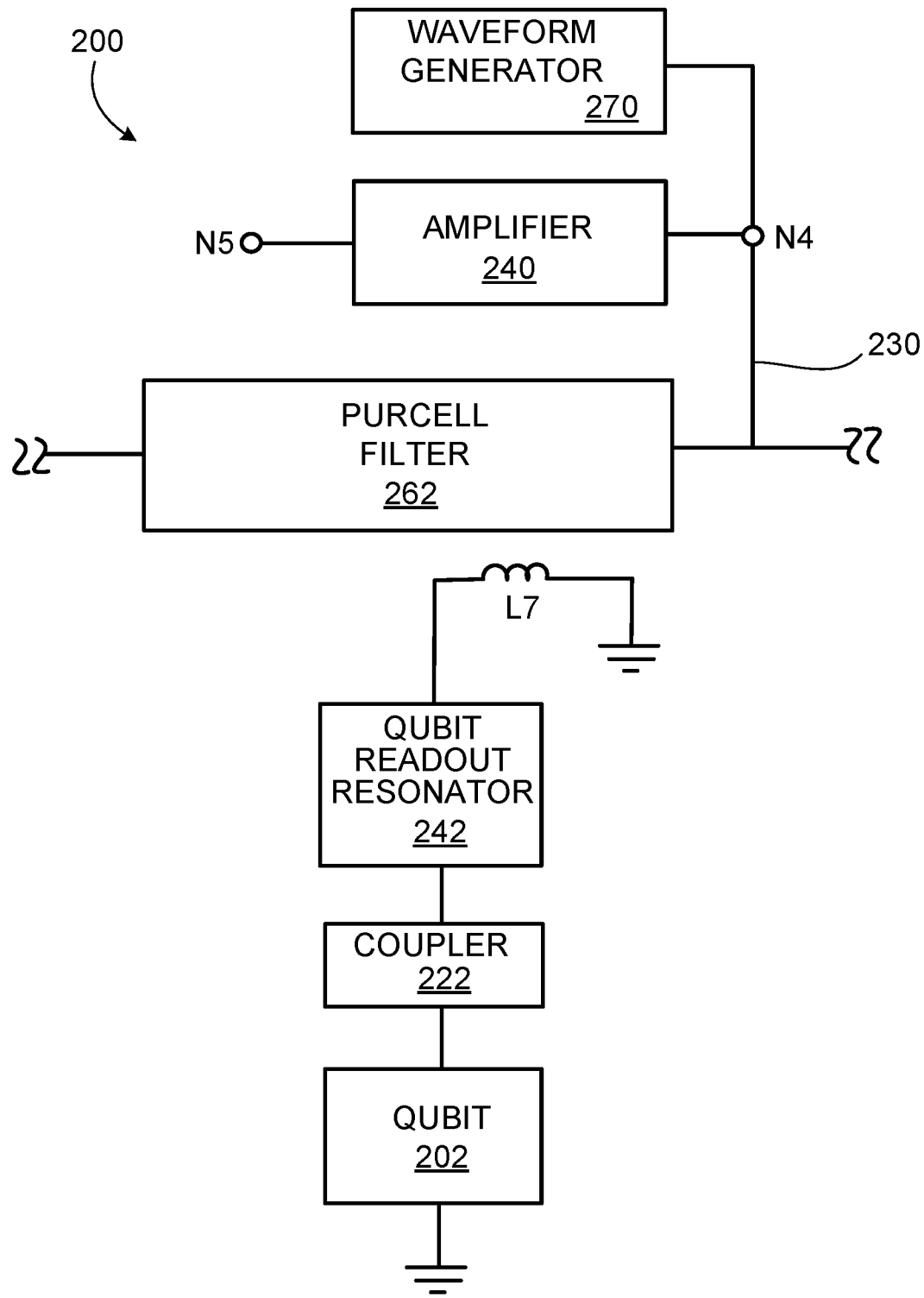
FIG. 2A is a diagram illustrating an example qubit system including a single qubit and a common port.

FIG. 2A illustrates an example qubit system 200 including a common port 230 for both providing an input drive tone and for receiving an output from a qubit readout resonator, in which the common port configuration can, in some implementations, reduce or prevent leakage of measurement photons. The qubit system 200 performs readout measurement operations for one or more qubits. The qubit system 200 includes a qubit-readout resonator pair, a filter, a common port, a waveform generator, and an amplifier.

The qubit system 200 includes a qubit-readout resonator pair. The qubit-readout resonator includes a qubit and a qubit readout resonator that is coupled to the qubit. For example, the qubit-readout resonator pair of the qubit system 200 includes a qubit 202. The qubit 202 can be implemented with various qubits. For example, the qubit 202 can be superconducting qubits such as transmon qubits, x-mon qubits, or flux-mon qubits. Although FIG. 2A illustrates that the qubit system 200 includes one qubit, the number of the qubits is not limited to a particular number.

The qubit-readout resonator pair of the qubit system 200 includes a qubit readout resonator 242. The qubit readout resonator 242 is indirectly coupled to the qubit 202 through a coupler 222. In some implementations, the coupler 222 can be a capacitive coupler having suitable capacitance to couple the qubit 202 to the qubit readout resonator 242. Alternatively, in some other implementations, the coupler 222 can be an inductive coupler having suitable inductance to couple the qubit 202 to the qubit readout resonator 242. In some implementations, the coupler 222 is not necessary, and the qubit readout resonator 242 is directly and electromagnetically coupled (e.g., inductively or capacitively) to the qubit 202.

Since the qubit readout resonator 242 is coupled to the qubit 202, a frequency of the qubit readout resonator 242 is determined based on a state of the qubit 202. Where a state of the qubit 202 is changed from a first state to a second state, a frequency of the qubit readout resonator 242 coupled to the qubit 202 is shifted accordingly, such that the frequency is indicative of the qubit state. By measuring the frequency of the qubit readout resonator 242, the qubit system 200 can perform a readout measurement operation for the qubit 202 coupled to the qubit readout resonator 242. The qubit readout resonator 242 may be configured, e.g., as a co-planar waveguide resonator, a stripline resonator, or a microstrip resonator, among other types of resonator structures. The qubit readout resonator 242 may be formed from superconducting material, such as aluminum, niobium, and/or titanium nitride.

The qubit system 200 includes a filter 262. Although FIG. 2A illustrates that the qubit system 200 includes one filter, the number of the filters is not limited to a particular number. The qubit system 200 can include any suitable number of filters. In some implementations, the qubit system 200 can include the same number of filters with qubits. In some other implementations, the qubit system 200 can include more or less number of filters than qubits. The filter 262 may be formed from a resonator structure, such as a co-planar waveguide resonator, a stripline resonator, or a microstrip resonator. The filter structure may be formed from superconductor material, such as aluminum, niobium, and/or titanium nitride.

The filter 262 is coupled to the qubit readout resonator 242 through an inductors L7. In some implementations, the inductor L7 corresponds to a portion of the qubit readout resonator 242. Although FIG. 2A illustrates inductive coupling between the filter 262 and the qubit readout resonator 242 using the inductor L7, any suitable coupling techniques can be used in various implementations. For example, the filter 262 can be coupled to the qubit readout resonator 242 using a capacitive coupling technique.

In some implementations, the filter 262 can be Purcell filter. A Purcell filter impedes the propagation of a photon emitted from a qubit at a qubit frequency, e.g., 7 GHz. Thus, the filter 262 prevents energy leakage of the qubit 202 when the qubit 202 operates at the qubit frequency. In addition, a Purcell filter allows the propagation of a signal, e.g., a microwave signal, at a resonator frequency, e.g., 4.5 GHz. Thus, the filter 262 allows a signal, e.g., a probe signal, for driving the qubit readout resonator 242 to pass through the filter 262.

In some implementations, the filter 262 can be a bandpass filter. For example, the bandpass filter can be implemented as a quarter-wave ($\lambda/4$) or a half-wave ($\lambda/2$) coplanar waveguide filter. In some other implementations, the filter 262 can be any suitable filter including, but not limited to: a low-pass filter, a high-pass filter, or a stepped impedance filter.

In some implementations, the qubit frequency can be with a first frequency range and the resonator frequency can be within a second frequency range. The first frequency range and the second frequency range do not have a common frequency range. In some implementations, the stop band of the Purcell filter and the first frequency range do not have a common frequency range. In some implementations, the stop band of the Purcell filter and the second frequency range have a common frequency range.

The qubit system 200 includes a single port 230 for receiving an input signal (e.g., a qubit readout resonator drive tone) and an output signal (e.g., measurement photons from the qubit readout resonator). In this implementation, an input signal or an output signal is transferred through the same port, i.e., the common input/output port 230. This single port architecture gives more freedom to design a layout of a chip to implement the qubit system 200 because the single port architecture reduces the number of ports used for transferring an input signal and an output signal relative to a qubit system including an input port and a separate output port. The single port 230 is coupled to a node N4 that can be used as both an output node and an input node. The node N4 is coupled to the waveform generator 270 to receive a probe signal, i.e., an input signal, from the waveform generator 270. For example, the waveform generator 270 may provide a drive tone for driving a qubit readout resonator. In addition, the node N4 is coupled to the amplifier 290 to provide an output signal from the qubit readout resonator 242. The amplifier 290 amplifies the output signal received through the node N4 and provides the amplified output signal to a node N5. In this implementation, the waveform generator 270 and the amplifier 290 are coupled to a ground.

In some implementations, an ADC can be coupled to the node N5. In some implementations, one or more circulators can be coupled the node N5 to protect the amplifier 290 from noise passing through the output port in reverse. In some implementations, one or more circulators can be coupled to the node N5 to protect the qubit readout resonator 242 from backwards propagating noise from the amplifier 290. For example, one or more circulators can be coupled between a qubit and a parametric amplifier or between a parametric amplifier and a HEMT amplifier.

Figure 2B:
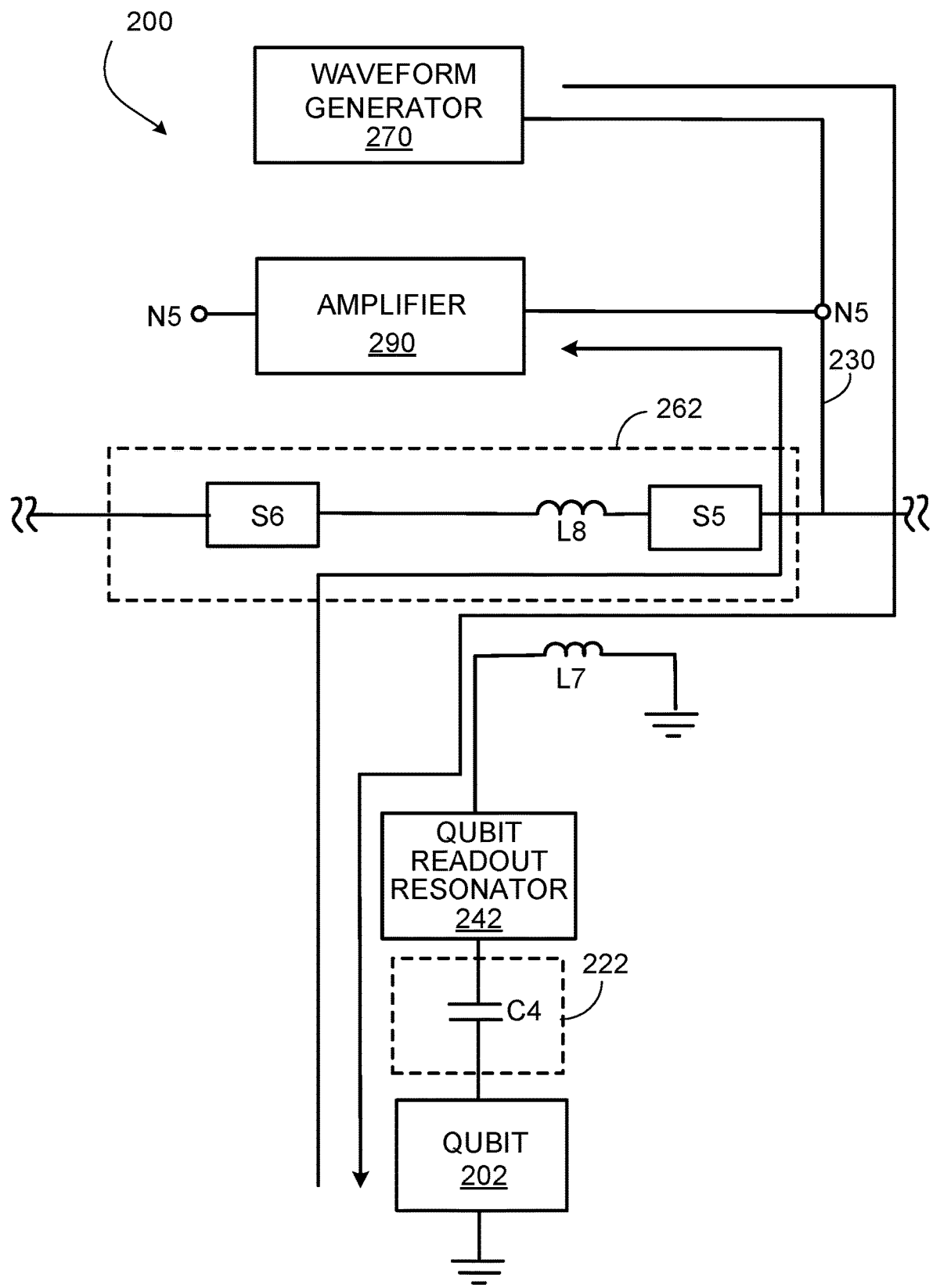
FIG. 2B is a diagram illustrating an example readout measurement operation for the qubit in FIG. 2A.

In order to better understand the operation of the qubit system of FIG. 2A, which has a single port for driving and reading qubits, a description directed to the operation of a qubit-readout resonator pair with respect to a filter is now provided. FIG. 2B illustrates an example readout measurement operation for the qubit 202 in FIG. 2A. The qubit system 200 in FIG. 2B is the qubit system 200 illustrated in FIG. 2A. In this example, the filter 262 is coupled to the common port 230 and the qubit-readout resonator pair including the readout resonator 242 and the qubit 202 is coupled to a portion, i.e., a coupling portion, of the filter 262. Where the qubit-readout resonator pair is coupled to the coupling portion of the filter 262, the coupling portion of the filter 262 can be defined as an inductor L8, a fifth portion of the filter 262 that exists between the coupling portion and the common port 230 can be defined as a fifth filter stub S5, and a sixth portion of the filter 262 that exists from the coupling portion to the left end of the filter 262 can be defined as a sixth filter stub S6. Thus, electrically equivalent elements of the filter 262 include the fifth filter stub S5, an inductor L8, and the sixth filter stub S6. The filter stubs S5, S6 may include any suitable type of filter including, but not limited to: a transmission-line filter, a lumped-element filter, or a combination of a transmission-line filter and a lumped-element filter. In some implementations, the coupling portion can be the center of the filter 262. Where the filter 262 is a half-wave coplanar waveguide filter, the filter stubs S5, S6 can be a quarter-wave coplanar waveguide filer. However, the coupling portion can be any portion of the filter 162 for various implementations and not limited to the center of the filter 262.

To perform a readout measurement operation for the qubit 202, the waveform generator 270 generates a probe signal and provides the probe signal to the filter 262 through the common port 230. The probe signal can have a frequency within a frequency range of the fifth filter stub S5. For example, where the fifth filter stub S5 is a bandpass filter having a frequency range from 4 to 5 GHz, a probe signal can have a frequency within the frequency range such that the probe signal can pass through the fifth filter stub S5. Once the probe signal passes through the fifth filter stub S5, the probe signal is transferred to the qubit readout resonator 242 through the inductors L8, L7. In some implementations, the probe signal can be transferred from the filter 262 to the qubit readout resonator 242 using a capacitive coupling technique.

The qubit readout resonator 242 is coupled to the qubit 202 through the coupler 222. In this implementation, the coupler 222 is a capacitive coupler including a capacitor C4. In some other implementations, the coupler 222 can be an inductive coupler including an inductor. Alternatively, as described herein, the coupler 222 can be part of the qubit readout resonator. As described herein, where the qubit readout resonator 242 is coupled to the qubit 202, the frequency of the qubit readout resonator 242 is determined based on the state of the qubit 202. Thus, by measuring the frequency of the qubit readout resonator 242, the qubit system 200 can measure the state of the qubit 202. To measure the frequency of the qubit readout resonator 242, the probe signal is provided to the qubit readout resonator 242 as described herein. In response to the probe signal, the qubit readout resonator 242 generates an output signal that has a particular frequency. For example, the output signal can have a frequency that matches a resonant frequency of the qubit readout resonator 242. Based on the frequency of the output signal, the frequency of the qubit readout resonator 242 can be measured.

In some implementations, the frequency of the output signal can be within the frequency range of the fifth filter stub S5. Thus, the output signal that is transferred to the fifth filter stub S5 through the inductors L7, L8 can pass through the fifth filter stub S5. The output signal is transferred to the amplifier 290 through the common port 230. The amplifier 290 amplifies the output signal because the output signal can be attenuated while the output signal is transferred from the qubit readout resonator 224 to the amplifier 290. The amplified output signal is provided to the node N3.

In the implementation of FIG. 2B, a route of the probe signal is from the waveform generator 270 to the qubit readout resonator 242 through the common port 230, the fifth filter stub S5, and the inductors L8, L7. Thus, while the probe signal is transferred from the waveform generator 270 to the qubit readout resonator 242, even if a photon is emitted from the qubit 202, the propagation of the photon is impeded by the fifth filter stub S5 or the sixth filter S6 because the filter stubs S5, S6 impedes the propagation of a photon emitted from the qubit 202 at a qubit frequency, but allows the propagation of the probe signal at a resonator frequency. This prevents energy leakage of the qubit 202 such that the efficiency of the qubit system 200 is improved.

In some implementations, the qubit system 200 can include a filter that has multiple poles. The multiple pole filer design prevents energy leakage of a qubit better than a single pole filter design, improving energy efficiency of the qubit system. Also, since a single filter has multiple poles, less filters can be used in the qubit system. Thus, the qubit system can have a compact design.

Figure 3:
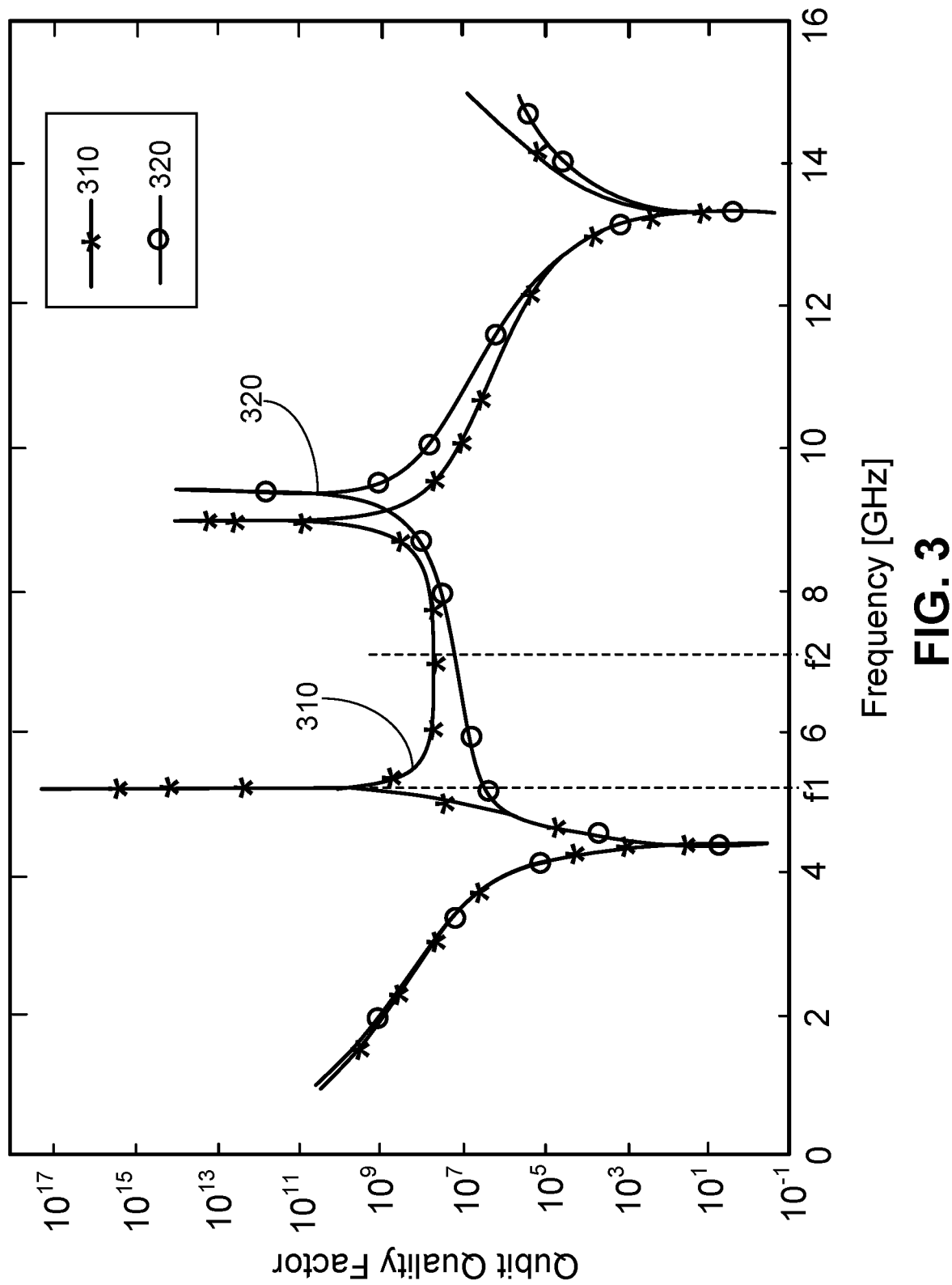
FIG. 3 is a graph showing example relationships between a quality factor of a qubit and a frequency of a qubit for various implementations in FIGS. 1A to 2B.

FIG. 3 is a graph showing example relationships between a quality factor of a qubit and a frequency of a qubit for various implementations in FIGS. 1A to 2B. In the graph in FIG. 3, an x-axis represents a qubit frequency of a qubit and a y-axis represents a quality factor e.g., Q-value, for the qubit.

In some implementations, a first frequency f1 represents a resonator frequency, e.g., 4.5 GHz. A probe signal received from a waveform generator, e.g., the waveform generator 270 in FIG. 2A, can have the resonator frequency. A second frequency f2 represents a qubit frequency, e.g., 7 GHz. Measurement photons received from one or more qubits can have the qubit frequency. As described above, a Purcell filter allows the propagation of a signal at the resonator frequency, but impedes the propagation of a photon emitted from a qubit at the qubit frequency. Thus, a Purcell filter allows the propagation of a signal having the first frequency f1, but impedes the propagation of a photon emitted from a qubit at the second frequency f2.

The line 310 shows an example relationship between a quality factor of a qubit and a frequency of a qubit for the qubit system described with reference to FIG. 2B. However, the line 310 has a peak at or near the first frequency f1, e.g., the resonator frequency. This represents that the qubit system 200 has a good qubit quality factor at the first frequency f1, e.g., the resonator frequency. The line 310 shows that the filters of the qubit system 200 effectively impedes the propagation of the photons while the probe signal is transferred such that energy leakage is reduced or eliminated.

The line 320 shows an example relationship between a quality factor of a qubit and a frequency of a qubit for the qubit system described with reference to FIGS. 1C and 1D. The line 320 does not have a peak at or near the first frequency f1, e.g., the resonator frequency. This represents that the qubit system 100 has a bad qubit quality factor at the first frequency f1, e.g., the resonator frequency. The line 320 shows that the filters of the qubit system 100 does not effectively impede the propagation of the photons while the probe signal is transferred such that energy leak occurs.

Figure 4:
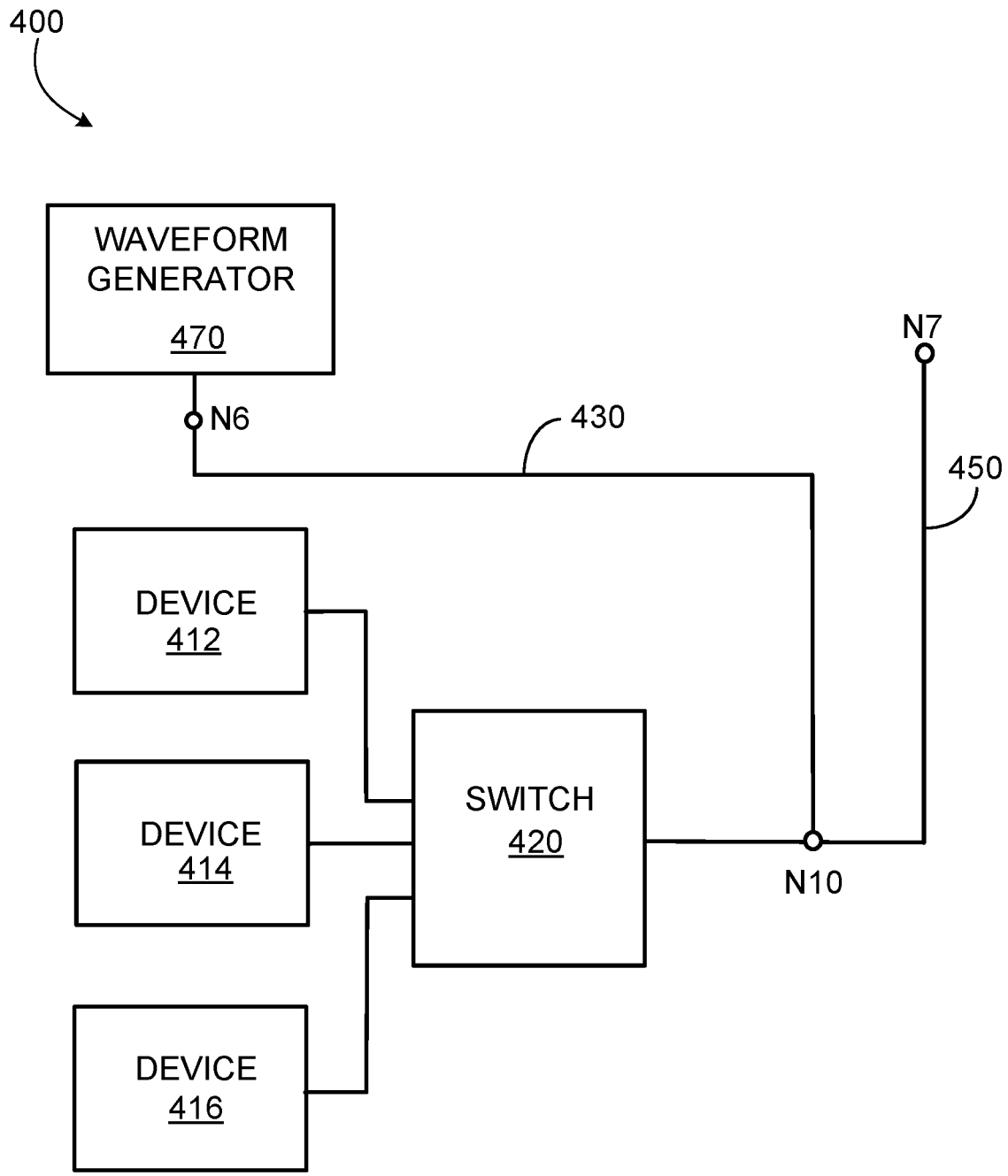
FIG. 4 is a diagram illustrating an example qubit system including a single input port.

FIG. 4 illustrates an example qubit system 400 including a single input port. The qubit system 400 includes multiple devices 412, 414, 416. The devices 412, 414, 416 can include one or more qubits respectively. For example, each of the devices 412, 414, 416 can include a qubit, a qubit readout resonator, and a filter as described with reference to in FIGS. 2A and 2B.

The qubit system 400 performs readout measurement operations for one or more qubits in the devices 412, 414, 416. In this implementation, the readout measurement operations for the multiple devices 412, 414, 416 can be performed using a single input port 430.

To perform a readout measurement operation for one or more qubits in the devices 412, 414, 416, the waveform generator 470 generates a probe signal. For example, the waveform generator 470 may provide a drive tone for driving a qubit readout resonator. An input node N6 is coupled to the waveform generator 470 to receive one or more probe signals from the waveform generator 470. The one or more probe signals are provided to a switch 420 through an input port 430.

The switch 420 determines to which device the probe signal should be sent. In some implementations, the switch 420 can provide the probe signal to one of the devices 412, 414, 416. In some implementations, the switch can 420 provide the probe signal to multiple devices of the devices 412, 414, 416.

Measurement operations for the qubits in the devices 412, 414, 416 can be similar to the measurement operations for the qubit 202 described with reference to FIG. 2B. Once the measurement operations are performed and measurement photons are received from the qubits in at least one of the devices 412, 414, 416, the switch 420 provides the measurement photons to an output port 450 that is coupled to a node N7. Any device that is coupled to the node N7 can receive the measurement photons. Examples of the device that can be coupled to the node N7 include, but not limited to: one or more isolators, one or more circulators, one or more amplifiers (e.g., parametric amplifiers or High Electron Mobility Transistor amplifiers), and a combination of thereof. The one or more devices coupled to the node N7 leads to an ADC at room temperature. In some implementations, the input port 430 and the output port 450 can be implemented as a common port.

In this implementation, since the measurement operations for the multiple devices 412, 414, 416 can be performed using the single input port 430, the qubit system 400 can use less number of ports relative to a qubit system including multiple input ports. Thus, the qubit system 400 can be implemented as having a smaller volume relative to the qubit system including multiple input ports. In particular, the qubit system 400 can be operated in a fridge. Thus, by reducing the volume of the qubit system 400, energy to maintain the qubit system 400 can be reduced.

In some implementations, the input port 430 and the output port 450 can be joined at a node N10. The probe signal can be transferred from the input node 430 to the switch 420 through the node N10. The measurement photons can be transferred from at least one of the devices 412, 414, 416 to the output port 450 through the node N10. In some implementations, one or more circulators can be coupled the node N10 to protect an amplifier that is coupled to the node N7 from noise passing through the output port 450. In some implementations, one or more circulators can be coupled to the node N7 to protect one or more qubit readout resonators in the devices 412, 414, 416 from backwards propagating noise from an amplifier that is coupled to the node N7.

Figure 5A:
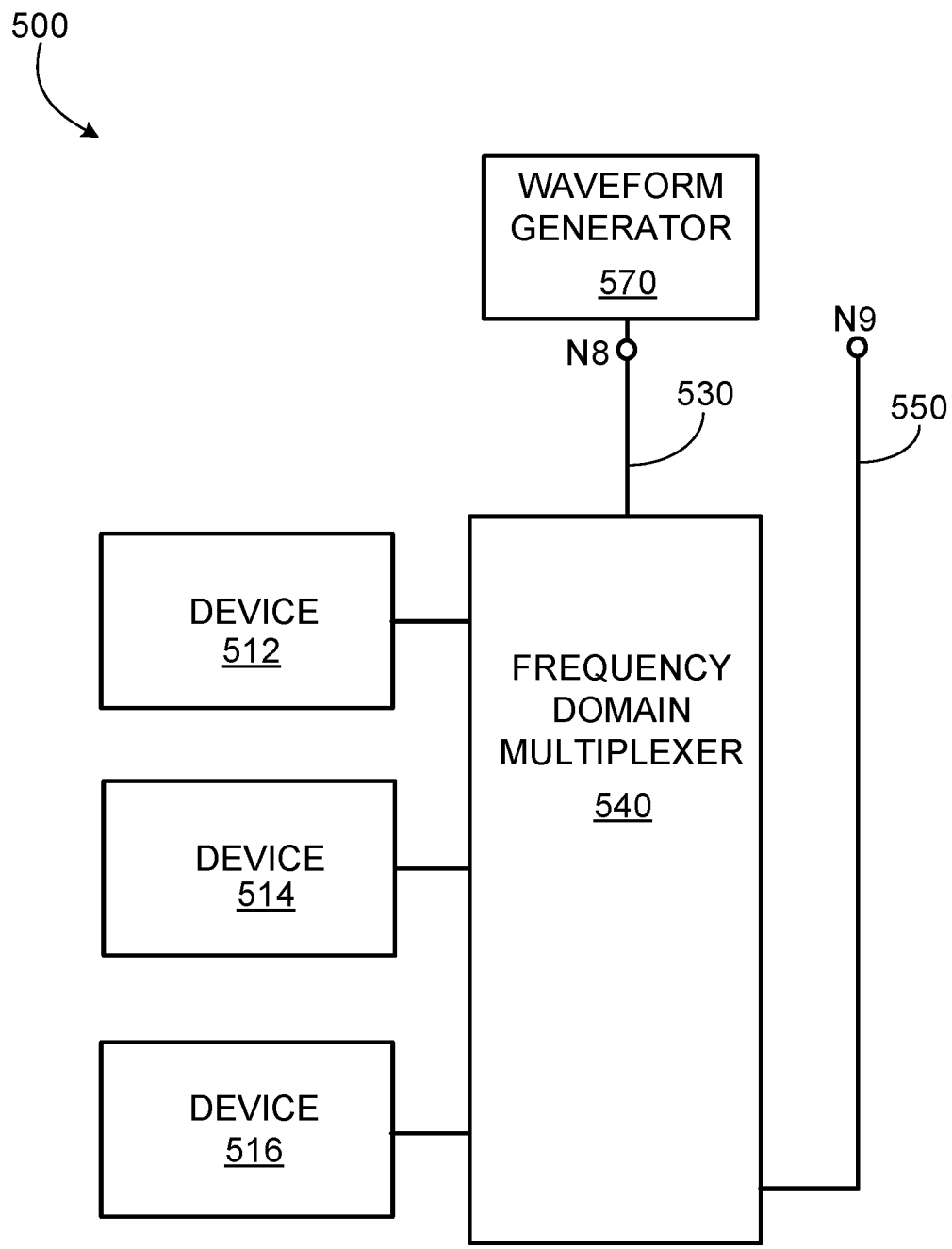
FIG. 5A is a diagram illustrating an example qubit system including an FDM.

FIG. 5A illustrates an example qubit system 500 including an FDM. The qubit system 500 includes multiple devices 512, 514, 516. The devices 512, 514, 516 can include one or more qubits respectively. For example, each of the devices 512, 514, 516 can include a qubit, a qubit readout resonator, and a filter as described with reference to in FIGS. 2A and 2B.

The qubit system 500 performs readout measurement operations for one or more qubits in the devices 512, 514, 516. In this implementation, the readout measurement operations for the multiple devices 512, 514, 516 can be performed using an FDM 540.

To perform a readout measurement operation for one or more qubits in the devices 512, 514, 516, the waveform generator 570 generates a probe signal. For example, the waveform generator 570 may provide a drive tone for driving a qubit readout resonator. The waveform generator 570 can generate multiple probe signals having a respective frequency. For example, the waveform generator 570 can generate a first probe signal having a first frequency, e.g., 4 GHz, a second probe signal having a second frequency, e.g., 5 GHz, and a third probe signal having a third frequency, e.g., 6 GHz. An input node N8 is coupled to the waveform generator 570 to receive one or more probe signals from the waveform generator 570. The one or more probe signals are provided to the FDM 540 through an input port 530.

Based on the frequency of the probe signal, the FDM 540 provides the probe signal to one of the devices 512, 514, 516. For example, where a resonator frequency of the device 512 is the first frequency, the FDM 540 provides the first probe signal having the first frequency to the device 512. As another example, where a resonator frequency of the device 514 is the second frequency, the FDM 540 provides the second probe signal having the second frequency to the device 514. As another example, where a resonator frequency of the device 516 is the third frequency, the FDM 540 provides the third probe signal having the third frequency to the device 516.

Measurement operations for the qubits in the devices 512, 514, 516 can be similar to the measurement operations for the qubit 202 described with reference to FIG. 2B. Once the measurement operations are performed and measurement photons are received from the qubits in at least one of the devices 512, 514, 516, the FDM 540 provides the measurement photons to an output port 550. In some implementations, a parametric amplifier can be coupled to the FDM 540. The parametric amplifier can amplify the measurement photons to increase the signal-to-noise ratio. The output port 550 is coupled to a node N9. Any device that is coupled to the node N9 can receive the measurement photons. Examples of the device that can be coupled to the node N9 include, but not limited to: one or more isolators, one or more circulators, one or more amplifiers (e.g., parametric amplifiers or High Electron Mobility Transistor amplifiers), and a combination of thereof. The one or more devices coupled to the node N9 leads to an ADC at room temperature. In some implementations, the input port 530 and the output port 550 can be implemented as a common port.

In this implementation, since the measurement operations can be performed for probe signals having various frequencies, the qubit system 500 can include various types of qubits and filters.

Figure 5B:
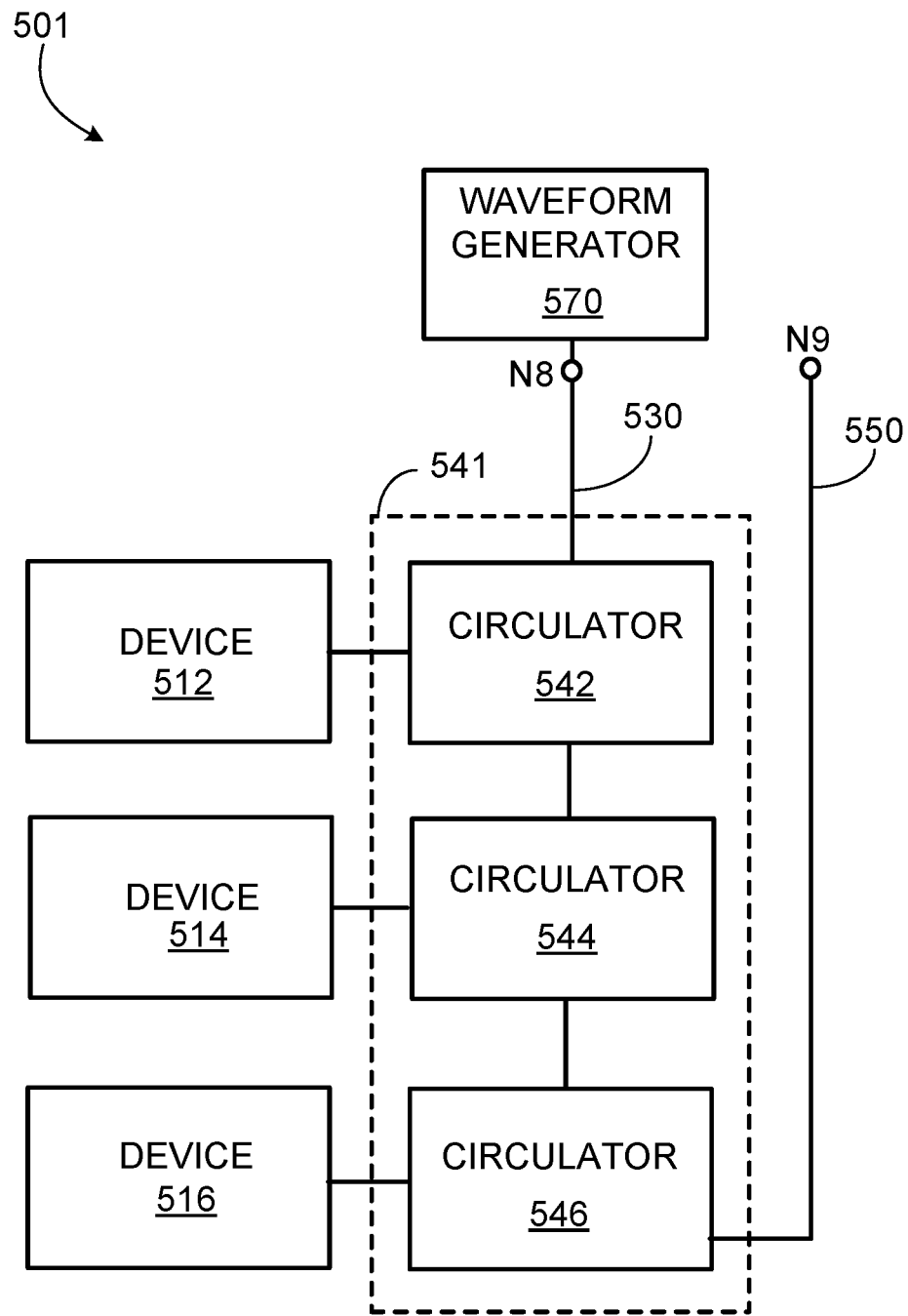
FIG. 5B is a diagram illustrating another example qubit system including an FDM.

FIG. 5B illustrates another example qubit system 501 including an FDM. In this example, the qubit system 501 can include the devices 512, 514, 516, the waveform generator 570, the input port 530, and the output port 550 described with reference to FIG. 5A. The qubit system 501 includes an FDM 541. The FDM includes multiple circulators 542, 544, 546. Each of the circulators 542, 544, 546 is coupled to a respective device of the devices 512, 514, 516. In some implementations, where the waveform generator 570 generates multiple probe signals having a respective frequency, each of the circulators 542, 544, 546 can provide a particular probe signal to a particular device based on a respective frequency of the particular probe signal. For example, the circulator 542 can provide a probe signal having a first frequency, e.g., a resonator frequency of the device 512, to the device 512, the circulator 544 can provide a probe signal having a second frequency, e.g., a resonator frequency of the device 514, to the device 514, and the circulator 546 can provide a probe signal having a third frequency, e.g., a resonator frequency of the device 516, to the device 516. These multiple circulators 542, 544, 546 prevents from losing photons emitted from the devices 512, 514, 516 such that improves quantum efficiency and measurement fidelity.

Implementations of the digital and/or quantum subject matter and the digital functional operations and quantum operations described in this specification can be implemented in digital electronic circuitry, suitable quantum circuitry or, more generally, quantum computational systems, in tangibly-implemented digital and/or quantum computer software or firmware, in digital and/or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, or multiple digital and quantum processors or computers, and combinations thereof. The apparatus can also be, or further include, special purpose logic circuitry, e.g., an FPGA (field programmable gate array), or an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum microprocessors or both, or any other kind of central digital and/or quantum processing unit. Generally, a central digital and/or quantum processing unit will receive instructions and digital and/or quantum data from a read-only memory, or a random access memory, or quantum systems suitable for transmitting quantum data, e.g. photons, or combinations thereof both.

The essential elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, or optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or electronic system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A system comprising:
a qubit;
a qubit readout resonator arranged adjacent to the qubit to couple to the qubit; and
a first filter arranged adjacent to the qubit readout resonator to couple to the qubit readout resonator, the first filter comprising:
a common port arranged to receive both a qubit readout resonator input drive signal and a measurement output signal from the qubit readout resonator, wherein the first filter is configured to impede at least one measurement photon emitted from the qubit,
wherein the first filter comprises a first filter stub, a coupling portion and a second filter stub,
wherein the first filter stub is disposed between the common port and a first side of the coupling portion and the second filter stub is disposed on a second side of the coupling portion, and
wherein the qubit readout resonator is coupled to the coupling portion.

2. The system of claim 1, further comprising:
a circulator coupled to the common port,
wherein the circulator is configured to separate the qubit readout resonator input drive signal from the measurement output signal on the common port.

3. The system of claim 1, further comprising:
a directional coupler coupled to the common port,
wherein the directional coupler is configured to separate the qubit readout resonator input drive signal from the measurement output signal on the common port.

4. The system of claim 1, wherein the first filter comprises a bandpass filter.

5. The system of claim 4, wherein the bandpass filter is a Purcell filter.

6. The system of claim 1, wherein at least one of the qubit readout resonator or the first filter comprises a microwave resonator.

7. The system of claim 6, wherein the microwave resonator includes a co-planar waveguide resonator, a strip-line resonator, or a microstrip resonator.

8. The system of claim 6, wherein the qubit readout resonator device and the first filter are formed from a superconductor.

9. The system of claim 1, wherein the qubit comprises a superconducting qubit or a spin qubit.

10. The system of claim 1, wherein the qubit comprises a qubit with a resonant frequency that is between 300 MHz and 300 GHz.

11. The system of claim 1, wherein the first filter stub includes at least one of a transmission-line filter or a lumped-element filter.

12. The system of claim 1, wherein the first filter is a half-wave coplanar waveguide filter, and
wherein the first filter stub is a quarter-wave coplanar waveguide filter.

13. The system of claim 1, wherein a stop band of the first filter stub is between 1 and 20 GHz.

14. The system of claim 1, further comprising:
a plurality of qubit devices, wherein each of the qubit devices includes:
a respective qubit,
a respective qubit readout resonator arranged adjacent to the respective qubit of the qubit device to couple to the respective qubit of the qubit device, and
a respective filter arranged adjacent to the respective qubit readout resonator of the qubit device to couple to the respective qubit readout resonator of the qubit device;
a common input port that is configured to receive a plurality of qubit readout resonator input drive signals for the plurality of qubit devices; and
a switch that is configured to provide at least one of the plurality of qubit readout resonator input drive signals to at least one of the plurality of qubit devices.

15. The system of claim 1, further comprising:
a plurality of qubit devices, wherein each of the qubit devices has a respective resonator frequency and comprises:
a respective qubit,
a respective qubit readout resonator arranged adjacent to the respective qubit of the qubit device to couple to the respective qubit of the qubit device, and
a respective filter arranged adjacent to the respective qubit readout resonator of the qubit device to couple to the respective qubit readout resonator of the qubit device;
a common input port that is configured to receive a plurality of qubit readout resonator input drive signals for the plurality of qubit devices, wherein each of the plurality of qubit readout resonator input drive signals has a respective frequency; and
a frequency domain multiplexer that is configured to provide, to a first qubit device of the plurality of qubit devices, a first qubit readout resonator input drive signal of the plurality of qubit readout resonator input drive signals based on a frequency of the first qubit readout resonator input drive signal being matched to the respective resonator frequency of the first qubit device.

16. The system of claim 1, further comprising:
an amplifier that is coupled to the common port and that is configured to amplify the measurement output signal from the qubit readout resonator.

17. The system of claim 16, wherein the amplifier includes a parametric amplifier or a High Electron Mobility Transistor amplifier.

18. The system of claim 1, further comprising
a plurality of qubit devices, wherein each of the qubit devices includes:
 a respective qubit; and
 a respective qubit readout resonator arranged adjacent to the respective qubit of the qubit device to couple to the respective qubit of the qubit device,
wherein the first filter is arranged to couple to the respective qubit readout resonators of each of the plurality of the qubit devices.

* * * * *

UNITED STATES PATENT AND TRADEMARK OFFICE
CERTIFICATE OF CORRECTION

| | | |
|---|---|---|
| PATENT NO. | : 11,669,765 B2 | Page 1 of 1 |
| APPLICATION NO. | : 16/768403 | |
| DATED | : June 6, 2023 | |
| INVENTOR(S) | : Kelly | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 405 days.

Signed and Sealed this
Twelfth Day of November, 2024

Katherine Kelly Vidal
*Director of the United States Patent and Trademark Office*